US009984874B2

(12) United States Patent
Caymax et al.

(10) Patent No.: US 9,984,874 B2
(45) Date of Patent: May 29, 2018

(54) METHOD OF PRODUCING TRANSITION METAL DICHALCOGENIDE LAYER

(71) Applicants: IMEC VZW, Leuven (BE); Katholieke Universiteit Leuven, KU LEUVEN R&D, Leuven (BE)

(72) Inventors: Matty Caymax, Leuven (BE); Markus Heyne, Leuven (BE); Annelies Delabie, Bierbeek (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days. days.

(21) Appl. No.: 15/039,407

(22) PCT Filed: Dec. 18, 2014

(86) PCT No.: PCT/EP2014/078441
§ 371 (c)(1),
(2) Date: May 12, 2017

(87) PCT Pub. No.: WO2015/091781
PCT Pub. Date: Jun. 25, 2015

(65) Prior Publication Data
US 2017/0250075 A1     Aug. 31, 2017

(30) Foreign Application Priority Data
Dec. 18, 2013 (EP) .................... 13198073

(51) Int. Cl.
*H01L 21/02* (2006.01)
*C23C 16/02* (2006.01)
(Continued)

(52) U.S. Cl.
CPC ........ *H01L 21/02568* (2013.01); *C23C 16/02* (2013.01); *C23C 16/305* (2013.01);
(Continued)

(58) Field of Classification Search
None
See application file for complete search history.

(56) References Cited

U.S. PATENT DOCUMENTS

2004/0023461 A1  2/2004  Ahn et al.
2006/0180811 A1  8/2006  Lee et al.
(Continued)

FOREIGN PATENT DOCUMENTS

EP       1790758 A1 *  5/2007  ............... C23C 8/02
WO   2012/093360 A1    7/2012

OTHER PUBLICATIONS

Radisavljevic, B. et al., "Single-Layer MoS2 Transistors", Nature Nanotechnology, vol. 6, Mar. 2011, pp. 147-151.
(Continued)

*Primary Examiner* — Stephen W Smoot
(74) *Attorney, Agent, or Firm* — McDonnell Boehnen Hulbert & Berghoff LLP

(57) ABSTRACT

Method of producing one or more transition metal dichalcogenide ($MX_2$) layers on a substrate, comprising the steps of: obtaining a substrate having a surface and depositing $MX_2$ on the surface using ALD deposition, starting from a metal halide precursor and a chalcogen source ($H_2X$), at a deposition temperature of about 300° C. Suitable metals are Mo and W, suitable chalcogenides are S, Se and Te. The substrate may be (111) oriented. Also mixtures of two or more $MX_2$ layers of different compositions can be deposited on the substrate, by repeating at least some of the steps of the method.

19 Claims, 5 Drawing Sheets

(51) Int. Cl.
    *C23C 16/30*     (2006.01)
    *C23C 16/455*     (2006.01)
    *C23C 16/56*     (2006.01)

(52) U.S. Cl.
    CPC ........ *C23C 16/45553* (2013.01); *C23C 16/56* (2013.01); *H01L 21/02052* (2013.01); *H01L 21/0262* (2013.01); *H01L 21/02068* (2013.01); *H01L 21/02381* (2013.01); *H01L 21/02433* (2013.01); *H01L 21/02488* (2013.01); *H01L 21/02658* (2013.01); *H01L 21/02661* (2013.01); *H01L 21/02664* (2013.01)

(56) References Cited

U.S. PATENT DOCUMENTS

| | | | |
|---|---|---|---|
| 2008/0105955 A1* | 5/2008 | Hao | C30B 23/02 257/627 |
| 2009/0311521 A1 | 12/2009 | Nikolov et al. | |
| 2011/0207283 A1 | 8/2011 | Haukka et al. | |
| 2011/0263115 A1 | 10/2011 | Ganguli et al. | |
| 2012/0171378 A1 | 7/2012 | Xiao et al. | |

OTHER PUBLICATIONS

Balendhran, Sivacarendran et al., "Two-Dimensional Molybdenum Trioxide and Dichalcogenides", Advanced Functional Materials, DOI: 10.1002/adfm.201300125, 2013, pp. 1-19.

Elam, J.W. et al., "Kinetics of the WF6 and Si2H6 Surface Reactions During Tungsten Atomic Layer Deposition", Surface Science, vol. 479, 2001, pp. 121-135.

PCT International Search Report and Written Opinion, PCT Application No. PCT/EP2014/078441, dated Jul. 10, 2015.

Scharf, T.W. et al., "Automatic Layer Deposition of Tungsten Disulphide Solid Lubricant Nanocomposite Coatings on Rolling Element Bearings", Tribology Transactions, vol. 52, 2009, pp. 284-292.

Butler, Sheneve Z. et al., "Progress, Challenges, and Opportunities in Two-Dimensional Materials Beyond Graphene", ACS Nano, vol. 7, No. 4, Apr. 23, 2013, pp. 2898-2926.

Jin, Zhenyu et al., "Novel Chemical Route for Atomic Layer Deposition of MoS2 Thin Film on SiOx/Si Substrate", Nanoscale, vol. 6, No. 23, Jan. 1, 2014, pp. 14453-14458.

\* cited by examiner

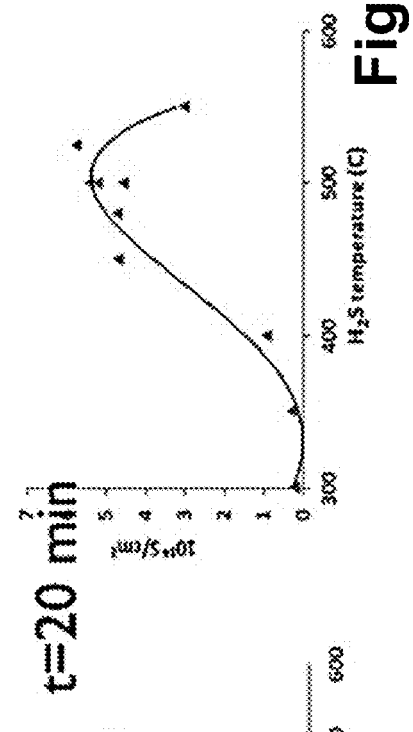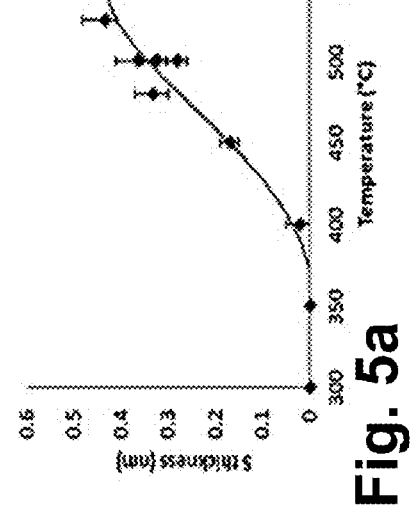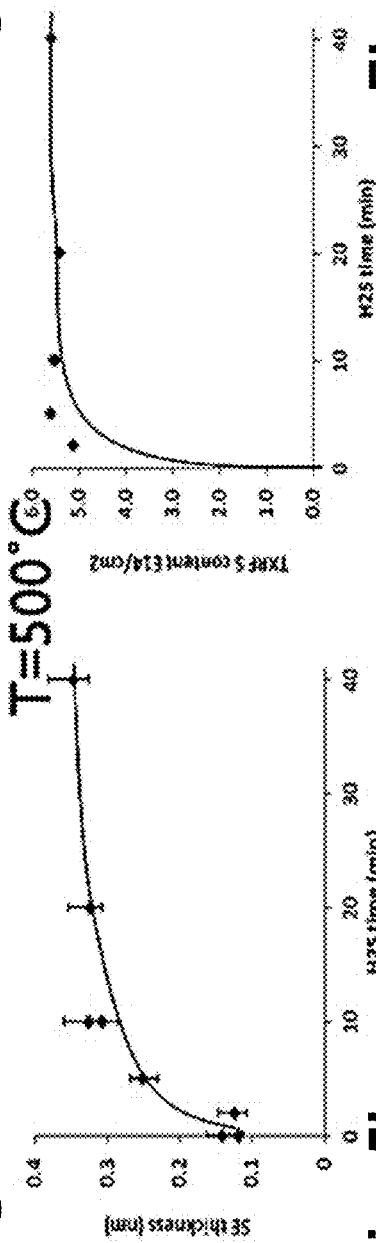
Fig. 5a  Fig. 5b  Fig. 5c  Fig. 5d

METHOD OF PRODUCING TRANSITION METAL DICHALCOGENIDE LAYER

CROSS-REFERENCE TO RELATED APPLICATION

The present application is a national stage entry of PCT/EP2014/078441 filed Dec. 18, 2014, which claims priority to European Patent Application No. 13198073.2 filed on Dec. 18, 2013, the contents of each of which are hereby incorporated by reference.

FIELD OF THE INVENTION

The invention relates to methods of producing transition metal dichalcogenide layers on a substrate. The invention relates in particular to methods of producing a limited number of layers, for instance less than seven layers of transition metal dichalcogenides on a relatively large substrate.

BACKGROUND OF THE INVENTION

As is well known, the number of transistors on integrated circuits approximately doubles every two years, in accordance with Moore's Law. However, the continuation of CMOS scaling beyond the 12 nm technology node will only be possible if device engineers replace the traditional silicon channel of e.g. a transistor by more powerful semiconductor materials. High carrier mobility materials such as germanium and/or compound semiconductor materials have now matured to an industrial development level, but even these material reach their limits in view of very small devices.

A next generation of materials are two-dimensional materials such as graphene, which is in fact a two-dimensional sheet of carbon atoms arranged in hexagonal rings. Graphene offers extremely high carrier mobilities but has basically no bandgap. Measures to open up the bandgap ('chemical functionalization') are known but deteriorate at the same time its mobility, hence graphene is losing much of its attraction as alternative MOS channel material.

Other two-dimensional materials got in the picture, such as transition metal dichalcogenides (TMDCs), denoted by the formula $MX_2$, where M denotes a transition metal such as e.g. W or Mo, and X denotes a chalcogen, i.e. a non-metal of the oxygen group, such as e.g. S, Se or Te. TMDCs have found interest as alternative candidate 2D materials due to the fact that they have a natural finite band gap, in contrast to graphene. Their unique structure moreover results in a highly inert, trap-free basal surface of the single crystals and enables fabrication of FETs with an intrinsically low field-effect threshold and a high mobility of charge carriers, comparable to that in the best single-crystal Si devices. Such TMDC materials, especially for instance $MoS_2$, are known already for a long time as lubricants, and have properties very similar to graphite. In their bulk state, they are composed of a layered material with strong in-plane bonding and weak out-of plane interactions (the layers are only weakly bonded by van der Waals forces), such that individual layers can easily move with respect to each other and in this way reduce friction between moving parts. It is known e.g. from WO 2012/093360 (A1) that the properties of a bulk structure with many layers of such material is quite different from the properties of only a single layer or a double layer of such material, so the question arises how such a single layer or double layer can be produced.

Similar as in graphite, individual layers of $MoS_2$ can be separated by the exfoliation technique (see e.g. B. Radisavljevic, A. Radenovic, J. Brivio, V. Giacometti and A. Kis, "Single-layer $MoS_2$ transistors", Nat. Nanotechnology 2011, 6, 147-151), resulting in flakes with dimensions on the order of 1-10 μm. In contrast to the single atomic graphene layer, $MX_2$ is composed of a single metal layer sandwiched between two chalcogen atomic layers which are each arranged in a 2D hexagonal honeycomb structure, as illustrated in FIG. 1. On the left of FIG. 1 a top view is shown, and on the right of FIG. 1 a side view is shown of a stack consisting of four tri-atomic layers. Hereafter, reference to such a tri-atomic layer structure will be made as a "monolayer" of $MX_2$ material. Two polymorphs of $MoS_2$ are the so-called 2H and 3R symmetries characterized by a different stacking of the monolayers, as illustrated in FIG. 2. Of these, the 2H is the more stable one. When reducing the thickness of $MX_2$ from several layers to one single monolayer, the bandgap evolves from indirect to direct, which makes it also interesting for optical applications in integrated circuits. Over the last few years, many reports emerged showing impressive progress in the development of 2D FETs with quite high mobility and very high $I_{on}/I_{off}$ ratios (see for instance S. Balendhran et al., "Two-Dimensional Molybdenum Trioxide and Dichalcogenides", Advanced Functional Materials 2013, DOI: 10.1002/adfm.201300125).

It is a major challenge however to produce $MX_2$ layers in relatively large areas and/or with the desired orientation (e.g. substantially parallel to the substrate) so as to make them fit for integration into high-volume semiconductor manufacturing on e.g. 300 or 450 mm semiconductor substrates, e.g. silicon wafers. The best known method for making device-quality $MX_2$ is the exfoliation technique applied on naturally occurring mono-crystals of $MX_2$. This results in tiny flakes of only few micrometer size. Many approaches have been studied to produce samples of layered $MX_2$, but as far as known to the inventors, so far none of them resulted in techniques suitable for manufacturing on industrial scale. Industrial alternatives to exfoliation are deposition methods. These methods can be categorized in vapor phase, liquid phase (electrodeposition, hydrothermal, sol/gel) and solid state techniques. In many cases, uncontrolled multi-layer deposits are obtained which still necessitates mechanical or other exfoliation steps. The liquid phase deposition and solid state reaction approaches did not prove very successful, and do not seem fit for large scale integration. There are mainly two routes of Vapor phase deposition, i.e. physical and chemical vapor deposition (PVD and CVD). Most of the PVD routes (e-beam evaporation, RF and DC sputtering, . . . ) have problems with obtaining flat layered structures and result rather in nanodots or nanotubes, or they are too slow and expensive (e.g. molecular beam epitaxy). Other approaches are based on consecutively depositing the metal or metal oxide (e.g. Mo or $MoO_3$) by evaporation followed by a chalcogenidation reaction in e.g. X or $H_2X$ vapor. As these reactions proceed typically at very high temperature, e.g. in the order of 650-1000° C., and/or require long annealing times, e.g. in the order of several hours, they are not very efficient. Moreover, often they do not result in large area flat deposits with the desired horizontal (i.e. parallel to the substrate surface) layering. Amongst the CVD routes, three processes can be considered: chemical vapor transport (CVT), regular CVD based on chemical precursors at temperatures above 600° C., and atomic layer deposition (ALD). For instance T. W. Scharf, D. R. Diercks, B. P. Gorman, S. V. Prasad & M. T. Dugger (2009) "Atomic Layer Deposition of Tungsten Disulphide Solid Lubricant Nanocomposite Coatings on Rolling Element Bearings", Tribology Transactions, 52:3, 284-292, discusses $WS_2$ deposition for use as lubricant coating on roller element bearings, and a process requiring catalysis by means of diethyl zinc $((C_2H_5)_2Zn)$ in order to initiate and maintain growth on $SiO_2$, $Al_2O_3$, stainless steel, gold or poly-crystalline silicon. However, the Zn which is co-deposited is not desirable for proper $MX_2$ qualities (a.o. crystalline state and electrical characteristics) for semiconductor applications.

SUMMARY OF THE INVENTION

It is an object of embodiments of the present invention to provide a good method for producing at least one two-dimensional transition metal dichalcogenide layer on a semiconductor, e.g. silicon substrate. A "layer of a 2D transition metal dichalcogenide" is made of a tri-atomic layer structure consisting of a single metal layer (or plane) sandwiched between two chalcogen atomic layers (or planes), and is also referred to herein as a "monolayer" of $MX_2$ material.

This objective is accomplished by a method according to embodiments of the present invention.

In a first aspect, the present invention provides a method of producing at least one transition metal dichalcogenide layer on a substrate. The method comprises:
a) obtaining a substrate having a surface;
b) depositing the transition metal dichalcogenide layer on the surface using ALD deposition, starting from a metal halide precursor and a chalcogen source. In embodiments of the present invention the ALD deposition may be thermal ALD deposition. In alternative embodiments of the present invention, the ALD deposition may be plasma enhanced ALD deposition (PEALD).

The substrate may be a semiconductor substrate, such as for instance a silicon substrate. The substrate may comprise at least one layer of dielectric material, which could be obtained for example by deposition, or by oxidation of the semiconductor material, the present invention not being limited thereto. The dielectric layer may comprise for example an oxide, for example an oxide layer. The substrate may be a SOI substrate, where a semiconductor layer is provided on top of a dielectric layer, on top of a substrate. For instance, an oxide layer (dielectric layer) may be provided on a silicon substrate, with a thin silicon layer or TiN layer on top of the oxide. The thin layer on top of the dielectric layer may comprise few monolayers of material, for example 2 monolayers, for example a single monolayer, and it may act as a sacrificial layer during ALD. The thickness of the layer of material on top of the dielectric layer may control the ALD process. It is an advantage of a method according to embodiments of the present invention that the need for a catalyst comprising Zn during ALD initiation can be avoided, which allows obtaining highly pure deposited films.

A method according to embodiments of the present invention may include a step of functionalization of the substrate surface before depositing the transition metal dichalcogenide layer. Functionalization may for example be performed with reagents such as $H_2S$, or silicon- or boron-hydrogen compounds (e.g. silane ($SiH_4$), disilane ($Si_2H_6$), trisilane ($Si_3H_8$), diborane ($B_2H_6$)), or a combination thereof, for example applied by plasma pulses. Alternatively, functionalization may be performed by means of an $O_3$ oxidation.

In embodiments of the present invention, functionalization may be performed on the surface of the substrate, in particular for instance on a sacrificial layer of the substrate, or on a dielectric top layer of the substrate.

The inventors have found that, by functionalizing the surface, e.g. sulphidizing the surface or treating it with ozone before depositing the transition metal dichalcogenide layer by the ALD technique, the need for a catalyst comprising Zn during the ALD initiation can be avoided, and hence a high purity film can be preserved, or in other words, the contamination of the transition metal dichalcogenide layer by unwanted chemical elements (such as e.g. carbon and/or Zn) can be reduced or even eliminated.

It is an advantage of embodiments of this method that it is an easy process, which is relatively cheap and relatively fast. The process allows relatively large area films on conventional substrate sizes (e.g. 200 mm or 300 mm or even 450 mm wafers), which makes it particularly suited for high-volume ULSI manufacturing using standard integration process flows.

It is a further advantage that a method according to embodiments of the present invention allows excellent film thickness control and uniformity. In particular, it allows to deposit for example only a single transition metal dichalcogenide monolayer, or only two transition metal dichalcogenide monolayers.

It is advantage of the method according to embodiments of the present invention that it allows to produce a product that can serve as donor wafer for full size blanket transition metal dichalcogenide layer transfer by exfoliation techniques.

The method is particularly suitable for producing channels comprising, or consisting of, transition metal dichalcogenides, as part of a transistor or TFET.

In a method according to embodiments of the present invention, depositing the transition metal dichalcogenide layer by using ALD deposition may comprise using thermal ALD, or may comprise using plasma-enhanced ALD (PEALD), wherein $H_2X$ plasma may be used. The plasma can be formed in pure $H_2X$ or in $H_2X$ gas mixtures, either dilutions with inert gas (He or Ar) or $H_2/H_2X$ gas mixtures can be used. PEALD may advantageously be performed after functionalization of the substrate, for example after functionalization comprising silicon- or boron-hydrogen reagents, although the present invention is not limited thereto and PEALD may be applied after sulphidizing, or after any other type of functionalization, or even directly on the obtained substrate, omitting the functionalization step.

In a method according to embodiments of the present invention, depositing the transition metal dichalcogenide layer by using ALD deposition may be performed at a deposition temperature in the range of 250° C. to 450° C.

It is advantageous to use the ALD process due to its ability to very precisely control thin layers at relatively low temperatures (e.g. below 500° C.), allowing less expensive equipment to be used. Moreover, ALD reactors are very well accepted in nowadays state-of-the-art semiconductor manufacturing.

A method according to embodiments of the present invention may furthermore comprise, before functionalizing the surface, removing a native oxide from the surface. In alternative embodiments of the present invention, for instance embodiments where a dielectric layer such as an $Al_2O_3$ layer is deposited on the substrate surface in order to protect the underlying substrate from etching, such removal of native oxide is not required.

In embodiments of the present invention, removing native oxide may comprise HF/$H_2O$ dipping the substrate. In particular embodiments of the present invention, this may leave approximately 10% of a monolayer of O on the surface, which is sufficient to expose the (111) Si surface for epitaxial seeding.

Removing native oxide may furthermore comprise $H_2$ baking of the substrate during at least five minutes at a temperature in the range of 700° C. to 800° C.

In a method according to embodiments of the present invention, functionalizing the surface may comprise an $O_3$ oxidation at 40° C. to 80° C. during 200 to 1000 msec. During such controlled $O_3$ oxidation, OH groups are provided to functionalize the surface.

In a method according to alternative embodiments of the present invention, functionalizing the substrate may comprise annealing the substrate with $H_2S$ at a temperature in the range of 300° C. to 550° C. during a period ranging from 1 to 40 minutes. During such operation, SH groups are provided to functionalize the surface.

In embodiments of the present invention, the metal of the metal halide precursor may be selected from the group consisting of Mo and W, and the chalcogen of the chalcogen source may be selected from the group consisting of S, Se and Te. $MoS_2$ and $WSe_2$ are advantageous because they have the highest mobilities. $MoS_2$ is particularly advantageous since:
- It is obtained from best known materials with regard to properties and synthesis (e.g. from catalysis research, lubricants, etc.)
- It has high thermal conductivity which is always good in devices with high transistor density
- Sulfides are expected to have a higher critical electrical field (at which the behavior changes from semiconductor to metal)

The substrate used in a method according to embodiments of the present invention may be a (111) oriented semiconductor substrate, or a substrate having a surface which is suitable for epitaxial seeding of a transition metal dichalcogenide layer.

It is an advantage of using a semiconductor substrate, e.g. a silicon substrate, in the (111) orientation as seeding layer for epitaxial growth of the transition metal dichalcogenides layer to be deposited, as this allows tight orientation control of this layer. More in particular, it allows to better control the angle between the plane containing the atomic metal layer and the surface of the substrate. This provides a.o. the advantages of 1) flat transition metal dichalcogenide layer (basal plane parallel to wafer surface), and 2) in principle no limitations to the area of the transition metal dichalcogenide layer (like in the exfoliation case) on large area wafers.

Although (111) Si wafers are not conventional for CMOS, such wafers are commercially available.

In a second aspect, the present invention provides a method of producing at least two transition metal dichalcogenide materials on a substrate. The method comprises the steps of:
1) providing a first metal dichalcogenide material on the substrate using a method of any embodiments of the first aspect of the present invention, thereby using a first metal halide precursor and a first chalcogen source; and
2) providing a second metal dichalcogenide material on the substrate by using ALD deposition, starting from a second metal halide precursor and a second chalcogen source, wherein the first metal halide precursor is different from the second metal halide precursor and/or the first chalcogen source is different from the second chalcogen source.

In embodiments of the present invention, the first and second metals and chalcogenides may be mixed inside the monolayer itself, such as for instance by forming a layer of $Mo_{(1-x)}W_xS_{2(1-y)}Se_{2y}$.

In alternative embodiments of the present invention, heterogeneous combinations of homogeneous monolayers, e.g. $MoS_2$ on top of $WSe_2$ may be made. Using multiple metal halide and/or chalcogenide precursors for the first resp. second layer, e.g. $MoF_6$ and $H_2S$ for the first layer, and $WF_6$ and $H_2Se$ for the second layer, or vice versa, allows to make a stack comprising mixtures of metal dichalcogenides, e.g. $MoS_2/WS_2$, in a predefined ratio. For example:
- a single $MoS_2$ monolayer in combination with a single $WS_2$ monolayer, or
- a single $MoS_2$ monolayer in combination with a double $WS_2$ monolayer, or
- a double $MoS_2$ monolayer in combination with a single $WS_2$ monolayer, or
- a double $MoS_2$ monolayer in combination with a double $WS_2$ monolayer.

In general, it is possible to deposit a first layer consisting of a first predefined number N1 of first monolayers (where N1 is an integer value in the range of 1 to 5, and to deposit a second layer consisting of a second predefined number N2 of second monolayers (where N2 is an integer in the range of 1 to 5. Moreover, the stack of all monolayers may be arranged as a lower part of the N1 first monolayers and an upper part of the N2 second monolayers, or as interleaved, e.g. alternating, first and second layers.

As another example, when using $MoF_6$ and $H_2S$ for depositing the first layer, and $MoF_6$ and $H_2Se$ for the second layer, or vice versa, one can make a mixed channel layer $MoS_2/MoSe_2$, in well-controlled ratios, e.g. predefined ratios. Such a method allows to make semiconductor structures with channels made of different materials in predefined ratios. This allows bandgap engineering of the deposited materials.

It is an advantage of a method according to embodiments of the present invention that it can be used to produce a film of a predefined thickness, e.g. having only a single monolayer, or only two monolayers, or a stack of a predetermined limited number of monolayers, for instance not more than seven monolayers, e.g. five monolayers or less.

It is an advantage of a method according to embodiments of the present invention that it is suitable for use in (industrial) manufacturing of transition metal dichalcogenide layers, that is, a method which is economical in terms of processing time, processing cost, and machinery.

It is an advantage of a method according to embodiments of the present invention that it is suitable for producing one or more 2D transition metal dichalcogenides layers on a relatively large area (e.g. on a substrate of at least 100 $cm^2$, such as for example on a semiconductor wafer of between 300 and 450 mm).

It is an advantage of a method according to embodiments of the present invention that it is capable of producing a stack of metal dichalcogenide ($MX_2$) layers with a predefined thickness and/or predefined orientation and/or an improved purity level (in particular with respect to carbon and/or zinc), or combinations thereof.

It is a further advantage of a method according to embodiments of the present invention that it allows to make mixtures of for example $WS_2$ and $MoS_2$ within the monolayer (which then gets a formula like $W_xMo_{1-x}S_2$, or of $WS_2$ and $WSe_2$, i.e. $WS_{2y}Se_{2(1-y)}$ as well as others, with closely controlled composition. The use of such mixtures allows tuning of electronic or optoelectronic properties of the devices manufactured with these layers.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 5(a) illustrates the thickness of an S-layer deposited on a substrate after 20 minutes, in function of temperature.

FIG. 5(b) illustrates the number of S atoms per unit area ($cm^2$) deposited on a substrate after 20 minutes, in function of temperature.

FIG. 5(c) illustrates the thickness of the S layer deposited at a temperature of 500° C., in function of time.

FIG. 5(d) illustrates the number of S atoms per unit area ($cm^2$) deposited at a temperature of 500°, in function of time.

Figure 1:
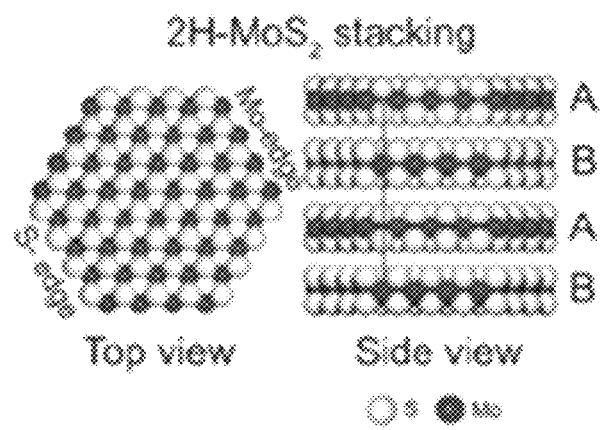
FIG. 1 shows a crystalline structure of $MoS_2$ in 2H configuration, in top view (left) and side view (right). The right part of the figure will be referred to as a stack of four monolayers.

The drawings are only schematic and are non-limiting. In the drawings, the size of some of the elements may be exaggerated and not drawn on scale for illustrative purposes. Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, when reference is made to a "monolayer of $MX_2$ material" or a "layer of a 2D transition metal dichalcogenide", reference is made to a tri-atomic layer structure consisting of a single metal layer sandwiched between two chalcogen atomic layers.

In this document, when reference is made to a "monolayer stack", reference is made to a structure comprising one or more monolayers. As an example, the right hand part of FIG. 1 illustrates a stack of four monolayers, each being a two-dimensional transition metal dichalcogenide layer, comprising a transition metal layer sandwiched in between two chalcogenide layers.

In this document, the unit of Angstrom is used, 1 Å=0.1 nm.

As described in the background section, atomic layer deposition (ALD) is a known technique for depositing two-dimensional (2D) transition metal dichalcogenides ($MX_2$) on a semiconductor, for instance silicon, substrate. This technique requires suitable precursors, which are volatile with sufficient vapor pressure at reasonable temperatures in order to inject them into the reactor. Suitable metal halide precursors are e.g. the metal hexafluorides, such as $WF_6$, $MoF_6$. $WF_6$ is a well-known gas in semiconductor manufacturing, used in dry etch processes. $MoF_6$ is a solid with melting point of about 17.5° C., and hence is liquid at room temperature (25° C.). They are commercially available. The present invention is not limited thereto, and other materials (e. g. comprising other halogens such as Cl) may be used.

An ALD process in embodiments of the present invention may be a thermal ALD process or a plasma enhanced ALD process. In a general ALD process, different precursors are injected into the reactor in consecutive pulses, and separated by purge steps with an inert purge gas. The assembly of pulses and purges is called a unit deposition cycle. In every precursor pulse, the precursor adsorbs on the surface until saturation. In a thermal ALD process, the precursors will react with the surface and form a chemical bond, activated by the temperature. In this case, heat is applied to initiate a chemical reaction between the surface and the adsorbent, so as to facilitate surface reactions which allow for the formation of thin films in a stepwise fashion. Chemical gases are carefully selected for ALD so that after a single pulse of the precursor, the surface is saturated and no further reactions take place. A plasma enhanced ALD process is an ALD process including a plasma enhancement step rather than a thermal activation. In a plasma enhanced ALD process, reactions are initiated by using energy from a plasma. The plasma enhancement can take place during one of the precursor pulses, or after any of the precursor pulses (metal halide precursor and chalcogen source).

Suitable chalcogen sources are $H_2X$, e.g. $H_2S$, $H_2Se$, $H_2Te$, all gaseous at room temperature and also well known in semiconductor manufacturing. They are also commercially available.

Typical overall half-reaction schemes for ALD deposition of $WX_2$, where X=S or Se or Te, are as follows:

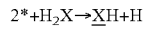  a.

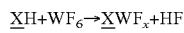  b.

with * denoting an active surface site and $\underline{X}H$ an XH group connected to a surface site.

HF is an extremely effective leaving group. As such, these precursors allow growth of very pure $MX_2$ films without substantial contamination such as e.g. by carbon, which can be found when using metalorganic precursors. It is known that this ALD sequence has difficulties in nucleating on semiconductor material such as silicon or on a dielectric such as $SiO_2$, and in the prior art the catalytic effect of DEZn (di-ethyl zinc) is used to solve that problem. This, however causes contamination of the $MX_2$ layer by undesired co-deposition of Zn.

The inventors of the present invention have discovered that the undesired deposition of Zn when using Zn or Zn compounds as a catalyst can be avoided by further preparation of the surface, for example by deposition of a dielectric layer of material on the substrate, and/or by functionalizing the semiconductor or dielectric surface, e.g. pre-treating the semiconductor or dielectric surface with $H_2S$, in other words by for instance sulfidizing the surface before applying ALD. At a temperature of about 500° C., this leads to a self-limiting reaction resulting in a monolayer coverage of the Si surface with sulphur. Any suitable ALD technique may be applied. For instance thermal ALD, or plasma enhanced ALD (PEALD), in which the deposition is enforced by plasma (by applying plasma during a unit deposition cycle, for example, applying $H_2X$ plasma pulse or a mixture of $H_2X$ and $H_2$ in a plasma pulse during the second pulse, or applying a $H_2$ plasma pulse after or during the first pulse, the present invention not being limited thereto).

A method according to embodiments of the present invention may comprise removing the native oxide layer from the substrate before functionalization. Additionally or alternatively, the surface may include a dielectric layer, for example obtained by deposition via ALD, for example deposition of $Si_3N_4$, $SiO_2$, of $Al_2O_3$, or otherwise providing a controlled oxidation of the surface (hence obtaining $SiO_2$). The surface may be obtained according any suitable technique, the present invention not being limited thereto. The method may include functionalization of the dielectric surface, or directly PEALD.

Avoiding using Zn may be done by performing thermal ALD directly on a substrate comprising a sacrificial layer. For example, the sacrificial monolayer or monolayer stack may be obtained by deposition, for example semiconductor deposition, or deposition of a very thin sacrificial layer or monolayer stack of dielectrics such TiN. The thickness of the sacrificial layer, for example 2 monolayers or less, may be used to control the deposition (for example, control of the thickness of the ALD layer). Examples of semiconductor materials suitable for the thin sacrificial layer are Si, GaAs, Ge, or any other semiconductor, the present invention not being limited to these examples. The step of functionalization may be omitted in case of deposition of a thin sacrificial layer.

Figure 3:
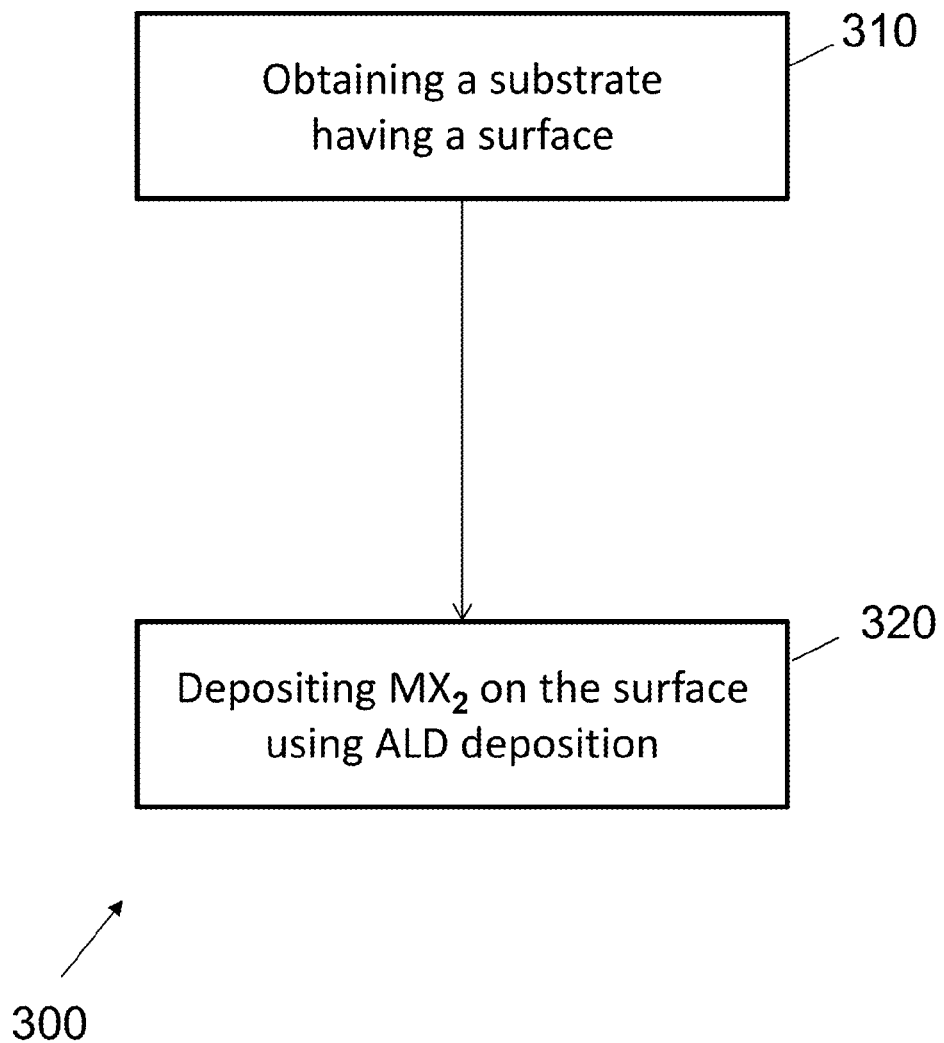
FIG. 3 illustrates a method according to embodiments of the present invention.

FIG. 3 illustrates in general steps of a method 300 according to embodiments of the present invention. A method according to embodiments of the present invention starts with obtaining 310 a substrate having a surface. The substrate can for instance be a semiconductor substrate, a conductive substrate, a dielectric substrate, or a combination thereof. The substrate can for instance be an SOI substrate, with a sacrificial layer, for instance a Si layer, or a TiN layer, on top of an insulating layer, for instance an oxide layer. The top layer may be a sacrificial layer, in which case functionalization may be omitted, and the step of deposition (using thermal ALD) may be directly applied. Alternatively, the substrate can comprise a semiconductor layer, for instance but not limited thereto a Si layer, a Ge layer, a GaAs layer, with a dielectric on top. The dielectric on top of the semiconductor layer may for instance be a $SiO_2$ layer, an $Al_2O_3$ layer, or an epitaxially grown mono-crystalline oxide. It is advantageous to use an epitaxially grown oxide, as the lattice constant of such oxide can be tailored so as to have a perfect match with the later on to be provided $MX_2$ layer.

In a second step 320, an $MX_2$ layer is deposited on the surface using ALD deposition, for example using thermal ALD, or for example using plasma enhanced ALD in those embodiments not comprising deposition of a sacrificial layer. The number of ALD cycles to be carried out, or the number of sacrificial layers, depends on the number of ALD layers to be deposited, typically less than ten in the context of the present invention, where it is desired to obtain thin $MX_2$ layers.

Optionally, a method according to embodiments of the present invention may comprise a further step 330, where the substrate surface is functionalized. Hereto, the substrate may for instance be sulphidized, i.e. the substrate surface is provided with an S-containing layer. Any suitable method to obtain this may be used. Typically a S-containing precursor such as $H_2S$ is used hereto. Alternatively, the substrate may be treated with ozone. Any suitable method to do this may be used.

Figure 4:
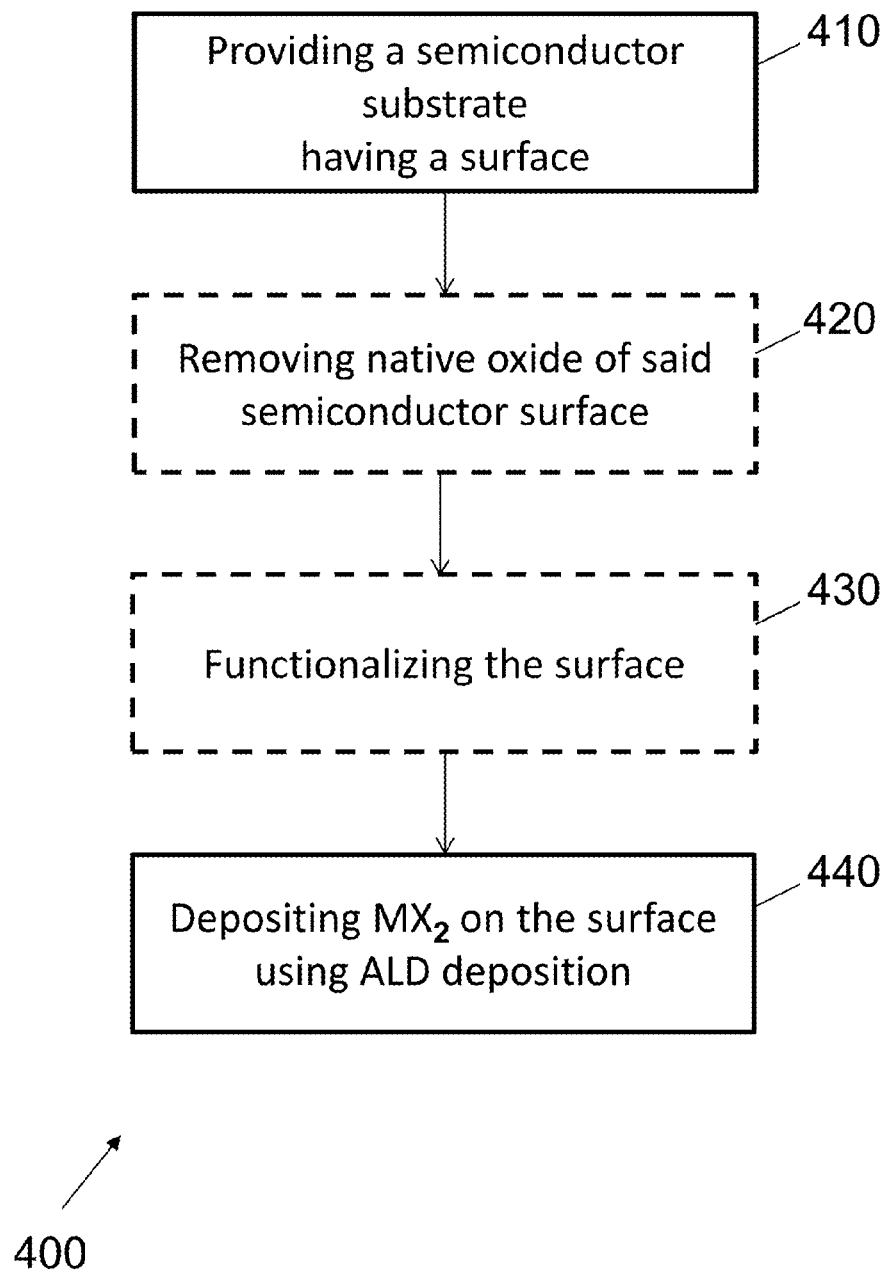
FIG. 4 illustrates a method according to particular embodiments of the present invention, where the substrate is a semiconductor substrate.

In a first example, the substrate is a semiconductor substrate, such as for instance, but not limited thereto, a silicon substrate. FIG. 4 illustrates method steps of a method according to embodiments of the present invention where the substrate is a semiconductor substrate. The method comprises a first step 410 of obtaining a semiconductor substrate. The semiconductor substrate has a surface. In an optional second step 420, native oxide is removed from the semiconductor substrate surface, after which in an optional third step 430 the bare semiconductor substrate is exposed to a functionalization component, e.g. an S-containing component, such as $H_2S$, so as to provide the substrate with an S-layer, or ozone. In case of functionalization by sulphidization or by ozone, the S coverage or O coverage may be about one monolayer. In a fourth step 440, this functionalization layer is used as a seed layer for providing an $MX_2$ layer by ALD deposition.

FIG. 5(*a*) to (*d*) show the particular example of how a sulfur layer is built up on a Si surface, after an HF dip and a 5 minutes 850° C. bake in $H_2$ to remove the last traces of the native oxide, for instance $SiO_2$. In case the semiconductor surface would be covered by crystalline oxides, for instance epitaxial, mono-crystalline oxides, which might be composed of $SiO_x$ and other oxides, for instance in mixed oxides, there is no need to remove these. The semiconductor, e.g. Si, surface is then pretreated by exposure to $H_2S$ in an inert gas, e.g. $N_2$, as carrier gas, at a temperature between 300 and 550° C., and at treatment times of 0.1 to 40 minutes. At 500° C., the S coverage increases to about a monolayer (as measured with TXRF) after about 10 minutes (cfr FIG. 5(*d*)). Cooling down to ALD growth temperature, between 100° C. and 400° C., for instance about 300° C., in $H_2$ results in a —SH coverage of the surface, which is an excellent active site for further ALD growth of the $MX_2$ material. This treatment can e.g. be performed in an ALD reactor with a temperature range up to at least 500° C., or a clustered system in which a substrate can be moved between a reactor for the $H_2S$ pre-treatment at 500° C. and a more conventional ALD chamber with a temperature range up to at least 350° C.

In order to induce reduction of the hexavalent metal ion (M6+), three pathways can be followed:
(i) Electrons can be captured from an n-type doped semiconductor substrate, e.g. Si substrate, especially in the case where epitaxial seeding from a (111) substrate is used, hence after removal of native oxide. Especially since only very thin $MX_2$ layers are needed (e.g. typically below 10 monolayers, e.g. up to 7 monolayers, preferably less than 5 monolayers), this is a viable approach.

(ii) By applying a $H_2$ plasma, reactive H radicals can interact with a metal halide (e.g. $MF_6$) in the chemistry as follows: $MF_6+H \rightarrow MH_5+HF$; $MF_5+H \rightarrow MH_4+HF$. In this way, H goes into a redox reaction with $MF_6$ resulting in the formation of HF and the reduction of the $M^{6+}$. In view of the low deposition temperature (e.g. less than 500° C.), it is unlikely that $H_2$ can initiate similar reactions (due to the thermal stability of $H_2$).

(iii) By adding a third reagent, i.e. $Si_2H_6$, which is a strong reducing agent, according to the overall reaction: $WF_6+Si_2H_6 \rightarrow W+2SiHF_3+2H_2$. This reaction is the basis of W ALD such as used for deposition of W contacts and vias in mainstream Si CMOS technology. A detailed description of W ALd using $WF_6$ and $Si_2H_6$ can be found in J. W. Elam, C. E Nelson, R. K. Grubbs and S. M. George, Kinetics of the $WF_6$ and $Si_2H_6$ surface reactions during tungsten atomic layer deposition, Surface Science 479 (2001) 121-135. In this reaction, Si from the $Si_2H_6$ molecule reacts with $WF_6$ to remove sequentially the F ions. Simultaneously, the $H^{1-}$ (hydride) ions from $Si_2H_6$ are converted to $H^0$ in $H_2$, which is the oxidation part of the redox system. In the case of embodiments of the present invention, however, different from the W ALD case, the reduction of $WF_6$ to W is stopped at the intermediate state of $W^{4+}$ due to the bonding with S at the stage of $WS_4$, since $WS_4$ is a more stable compound than W in these conditions. Due to the strong atomic Si—F bond, contamination by Si is not likely as $SiHF_3$ is a volatile reaction by-product and will be exhausted readily. Similar reaction schemes can be thought of for the other transitions metals as well as for the Se case.

The reaction sequence then could look as follows:
1. Providing a substrate and a surface
2. Providing a sulphur surface layer from $H_2S$ treatment at appropriate temperature
3. Injecting consequentially $WF_6$, $Si_2H_6$, and $H_2S$ in well-separated pulses including inert gas purges in between the pulses An alternative initiation procedure for ALD nucleation is to functionalize the semiconductor surface, e.g. Si surface, after native oxide stripping and $H_2$-bake for oxygen removal, by using $O_3$. With this process, it is possible to activate a semiconductor, e.g. Si, surface after substantially complete native oxide removal and reconstruction in a $H_2$ bake by depositing a monolayer of oxygen using $O_3$ oxidation at low temperature, e.g. about 40-80° C. After this functionalization, it is possible to grow an epitaxial semiconductor, e.g. Si, layer on top of this oxygen monolayer, which indicates that the O layer does not hamper epitaxial seeding from the underlying substrate. Using this approach, the Si surface can be functionalized with —OH groups which is an ideal active site for further ALD growth of $MX_2$ material. It is very likely that these OH groups allow further epitaxial line-up for $MX_2$ to be grown on top of this, starting with the sulfur layer, with S replacing O.

This first half cycle then ends up in a Si—O—SH or Si—SH sequence, which then is the starting of the $MX_2$ layer.

Figure 2:
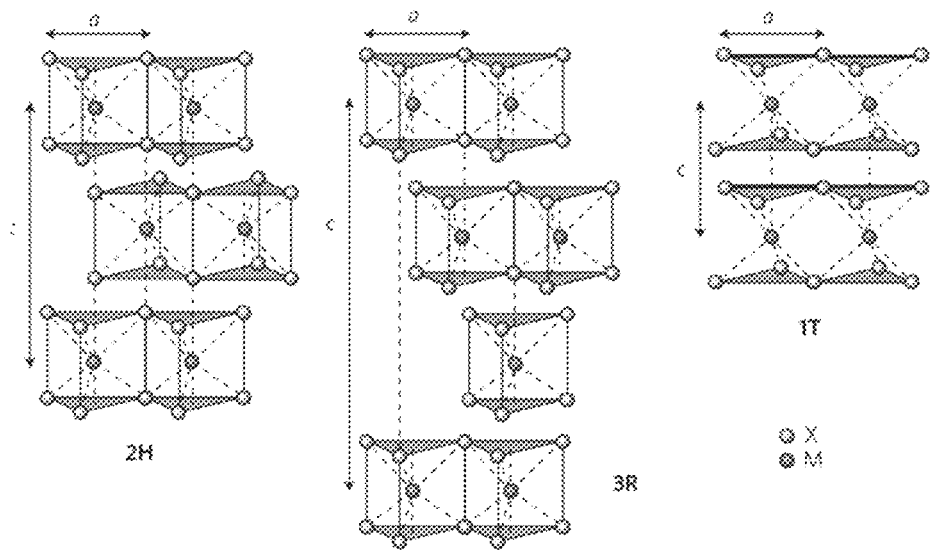
FIG. 2 shows crystalline structures of transition metal dichalcogenides $MX_2$ in 2H, 3R and 1T configuration, where X is an element selected from the group of S, Se and Te, and M is a transition metal selected from the group of W and Mo, 'a' is the unit cell parameter of the trigonal base plane, and 'c' is the inter-layer distance.

In order to control the desired planar orientation of the 2H basal plane of $MX_2$, it is advantageous to induce epitaxial seeding. The trigonal unit cell parameter 'a' of $MX_2$ (distance between two sulfur atoms, as shown in FIG. 2 ranges between 3.1 and 3.3 Å for M=W or Mo and X=S, Se or Te (thus for $WS_2$, $WSe_2$, $MoS_2$, $MoSe_2$, $WTe_2$, $MoTe_2$). The (111) Si atomic plane has a unit cell parameter (distance between two neighboring Si atoms) in the order of 3.8 Å. This means that a full monolayer coverage of sulfur on (111) Si can be an excellent seed for quasi-monocrystalline 2H MX$_2$. A misfit of about 15% is considerable, but in view of the extremely thin films envisaged (e.g. only a single or only two monolayers of MX$_2$ material), the stress induced by the lattice mismatch does not necessarily lead to large defect densities.

An even more interesting surface for epitaxial seeding is an epitaxial layer of wurtzite AlN grown on (111) Si substrates in AlN[0 0 01]//Si[1 1 1] relationship. The unit cell parameter a for (0001) AlN is 3.1, which is even closer to the unit cell parameter a of MX2. Another good surface can be offered by 4H or 6H SiC, also epitaxially grown on (111) Si. The a constant of 4H or 6H SiC is 3.07. Moreover, AlN and SiC are very wide bandgap materials, offering substantial electrical isolation between the MX$_2$ layer and the (111) Si substrate.

The resulting product of this process is a stack comprising a predefined number of layers of MX$_2$, for example but not limited thereto WS$_2$ or MoS$_2$, whereas a covalent silicon sulfide type of bond is not desired. The enthalpy of formation $\Delta H_f^\circ$ of SiS$_2$, WS$_2$ and MoS$_2$ is resp. −34.7, −46.3 and −61.2 kcal/mole, meaning that SiS$_2$ is the least stable of these three materials. In view of this, it is not unlikely that the formed MX$_2$ film can be detached from the Si surface, such as upon thermal annealing, and remains on the surface only by means of van der Waals forces.

In a second example, the substrate comprises a dielectric layer at the top. The substrate may for instance comprise a semiconductor layer with a dielectric such as Si$_3$N$_4$, or an oxide layer, e.g. SiO$_2$, Al$_2$O$_3$, HfO$_3$, ZrO$_2$, or an epitaxially grown oxide on top thereof. In such case, the optional step of stripping the native oxide from the surface (described in the previous example, with reference to FIG. 4) can be omitted if desired.

Figure 6:
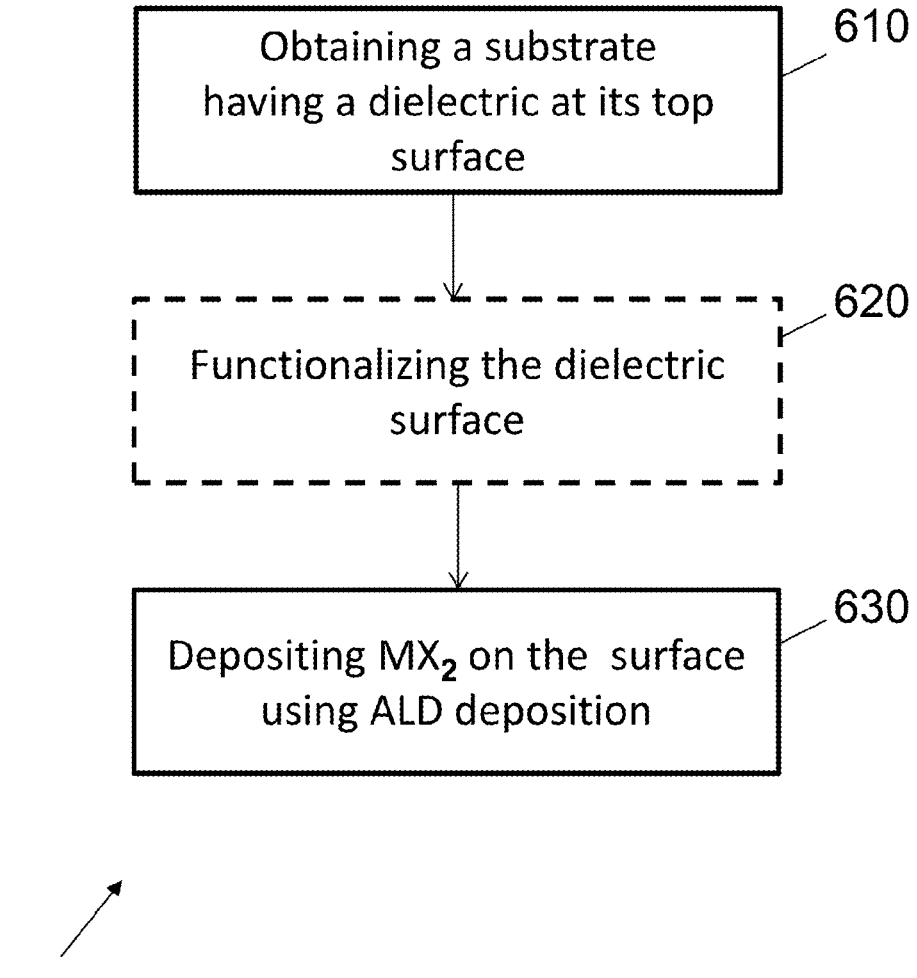
FIG. 6 illustrates a method according to particular embodiments of the present invention, where the substrate comprises a dielectric top layer.

A method 600 according to embodiments of the present invention is illustrated in FIG. 6.

In a first step 610, a substrate having a dielectric top surface, e.g. by means of a dielectric layer at its top, is obtained. Such dielectric layer can be provided by deposition, or a dielectric layer can be grown atop a semiconductor layer. For instance a Si substrate can be oxidized such that a SiO$_2$ layer atop the Si substrate is formed. Alternatively, the obtained substrate can simply be a completely dielectric surface.

In an optional second step 620, this dielectric substrate or top layer can be functionalized, for example sulphidized, for instance by replacing OH bonds by SH bonds. The sulphidizing step may for instance be carried out at a temperature between 300° C. and 500° C., during a time period between about 1 minute and about 1 hour. Alternatively, the optional functionalization may be performed with ozone. In some cases, a third reagent from the group of SiH$_4$, Si$_3$H$_8$, Si$_2$H$_6$, B$_2$H$_6$, may be included, for example as part of a plasma mixture.

In a further step 630, a layer of MX$_2$ is deposited on the optionally functionalized surface, using ALD deposition. The number of ALD cycles applied determines the thickness of the deposited MX$_2$ layer, which may be limited in the context of the present invention, e.g. less than ten layers, for instance not more than seven layers, not more than five layers, e.g. only one or two layers.

The choice of the type of ALD is determined by the type of treatment performed on the substrate. For example, thermal ALD may be used after sulphidization or functionalization with ozone (for example, after sulphidization and functionalization with ozone of a semiconductor substrate, or after functionalization of a dielectric substrate layer with e.g. SiH$_4$, Si$_2$H$_6$, Si$_3$H$_8$, B$_2$H$_6$ compounds).

Thermal ALD may comprise the unit cycle:
a) Metal halide precursor pulse
b) Purging with inert gas
c) H$_2$X pulse (e.g. H$_2$S pulse)
d) Purging with inert gas This sequence is suitable after functionalization or after providing a sacrificial layer. The thickness of the sacrificial layer would determine the thickness of the deposited layer. In case no sacrificial layer is used, the cycle may be repeated a number of times, which would determine the size of the deposition layer. The deposition may be performed between e.g. 250 and 450° C.

The optional functionalization may also comprise SiH$_4$, Si$_2$H$_6$, Si$_3$H$_8$, B$_2$H$_6$ compounds, in which case plasma can be advantageously used. In case the substrate is oxidized or otherwise covered by an oxide layer (e.g. by ALD), such as SiO$_2$ or Al$_2$O$_3$, PEALD may advantageously be performed on the dielectric layer, due to the fact that PEALD promotes nucleation on dielectric layers. The H$_2$(S) plasma may generate H atoms for the chemical reduction of M$^{6+}$. If in the present example a dielectric layer of SiO$_2$ is used, it can react with MF$_6$, binding the F atoms into the volatile SiF$_4$ or SiHF$_3$, thusly initiating the nucleation on the inert dielectric. PEALD may be advantageously performed after functionalization comprising silicon-hydrogen compounds, but it may be performed after any other type of functionalization. PEALD may also be performed directly on the substrate, omitting the functionalization. PEALD can be applied following the unit cycle
a) Metal halide precursor pulse
b) Purging with inert gas
c) Plasma pulse comprising H$_2$S, or mixture of H$_2$ and H$_2$X, or mixture of noble gasses with H$_2$X
d) Purging with inert gas The PEALD may also be performed according to complex unit cycles (or reaction cycles). Parameters like temperature, pulse time and purge times, number of cycles, and power of pulses may be optimized. Some examples of PEALD reaction cycles are:
  Metal halide and H$_2$ plasma cyclically, followed by pulse of H$_2$S.
  Metal halide precursor pulse, followed by cycles of H$_2$ plasma and H$_2$S
  Metal halide precursor pulse, followed by cycles of H$_2$S and H$_2$ plasma
  Cycles of metal halide and H$_2$S, followed by a pulse of H$_2$ plasma
  Cycles of metal halide and H$_2$ plasma, followed by cycles of H$_2$S and H$_2$ plasma
Purging can be done after or during a reaction cycle.

In a third example, the obtained substrate may include a sacrificial layer on the surface, for instance a semiconductive layer such as a Si layer, or a TiN layer. ALD deposition of an MX$_2$ layer may be performed on such substrate. In this example, the functionalization may be omitted and the ALD may be directly performed after obtaining the substrate, obtaining a wide deposition area and saving time.

The initial substrate may comprise a multi-layer structure, for example a semiconductor layer coated with a protective dielectric layer. The dielectric layer may be obtained, e.g. deposited, after removing native oxide, for example via H$_2$ plasma. The dielectric layer may comprise for example Si$_3$N$_4$, or crystalline Al$_2$O$_3$, or SiO$_2$ obtained by deposition or by oxidation of the substrate (in case of oxidation, the removal of native oxide may be omitted). The dielectric layer is in turn covered by a thin sacrificial monolayer or monolayer stack. In this example, a layer of semiconductor such as Si, Ge, GaAs, or others is applied. In the present case, the sacrificial layer can be obtained by deposition, for example by Molecular Beam Epitaxial (MBE) deposition. The thin layer shall ideally comprise one or two monolayers, which could be further protected by addition of a H-passivation layer. The thin layer, for instance thin Si layer, acts as a solid state reagent during thermal ALD, hence the thickness of the thin layer may be used to control the thickness of the dichalchogenide layer, as the amount of material in the thin layer, e.g. Si, controls the progress of the $MF_6$ reaction. Simultaneously, $H_2X$ will interact so as to bind with the released $M^{4+}$ and stabilize it as $MX_2$: $MF_6+Si+H_2X \rightarrow MX_2+SiF_4+2$ HF. The compound $SiHF_3$ may also form in the reaction. In this scheme, the thin layer, in the embodiment explained Si layer, can be seen as a sacrificial layer or as a solid state redox reagent. The ALD sequence in case of the sacrificial Si layer may be a thermal ALD as previously explained, optionally further comprising starting with one or more $H_2X$ pulses such that $H_2S$ is present abundantly when $MF_6$ will attack Si. Nonetheless, the present invention is not limited to a sacrificial layer comprising semiconductor, and the method can be broadened to other materials such as e.g. TiN.

In a second aspect, the present invention provides a method of producing at least two transition metal dichalcogenide materials on a substrate. The method comprises the steps of:
1) providing a first metal dichalcogenide material on the substrate using a method of any embodiments of the first aspect of the present invention, thereby using a first metal halide precursor and a first chalcogenide precursor; and
2) providing a second metal dichalcogenide material on the substrate by using ALD deposition, starting from a second metal halide precursor and a second chalcogen source, wherein the first metal halide precursor is different from the second metal halide precursor and/or the first chalcogen source is different from the second chalcogen source.

In embodiments of the present invention, the first and second metals and chalcogenides may be mixed inside the monolayer itself, such as for instance by forming a layer of $Mo_{(1-x)}W_xS_{2(1-y)}Se_{2y}$.

In alternative embodiments of the present invention, heterogeneous combinations of homogeneous monolayers, e.g. $MoS_2$ on top of $WSe_2$ may be made. Using multiple metal and/or chalcogenide precursors for the first resp. second layer, e.g. $MoF_6$ and $H_2S$ for the first layer, and $WF_6$ and $H_2Se$ for the second layer, or vice versa, allows to make a stack comprising mixtures of metal dichalcogenides, e.g. $MoS_2/WS_2$, in a predefined ratio. For example:
a single $MoS_2$ monolayer in combination with a single $WS_2$ monolayer, or
a single $MoS_2$ monolayer in combination with a double $WS_2$ monolayer, or
a double $MoS_2$ monolayer in combination with a single $WS_2$ monolayer, or
a double $MoS_2$ monolayer in combination with a double $WS_2$ monolayer.

In general, it is possible to deposit a first layer consisting of a first predefined number N1 of first monolayers (where N1 is an integer value in the range of 1 to 5, and to deposit a second layer consisting of a second predefined number N2 of second monolayers (where N2 is an integer in the range of 1 to 5. Moreover, the stack of all monolayers may be arranged as a lower part of the N1 first monolayers and an upper part of the N2 second monolayers, or as interleaved, e.g. alternating, first and second layers.

As another example, when using $MoF_6$ and $H_2S$ for depositing the first layer, and $MoF_6$ and $H_2Se$ for the second layer, or vice versa, one can make a mixed channel layer $MoS_2/MoSe_2$, in well-controlled ratios, e.g. predefined ratios. Such a method allows to make semiconductor structures with channels made of different materials in predefined ratios. This allows bandgap engineering of the deposited materials.

It is possible to use any suitable method according to the present invention, for example depositing a protective dielectric layer, a thin sacrificial layer and, via ALD, depositing a first dichalcogenide layer or monolayer stack, then depositing a second thin sacrificial layer and, via ALD, depositing a second dichalcogenide layer or monolayer stack. It is also possible to use functionalization, or deposition of dielectrics and functionalization, followed by ALD, for example PEALD or thermal ALD, or a combination of deposition techniques.

Summary:

$MX_2$ films of monolayer thickness (less than 1.0 nm) can be deposited by means of ALD starting from $MF_6$ and $H_2X$ precursors. ALD allows to deposit layers of monolayer thickness with extremely good uniformity, for instance with a standard deviation less than 1% within 1 sigma, at deposition temperatures of 250-450° C., even on large area substrates (e.g. up to 300-450 mm silicon wafers). The layer thickness can be controlled to be a predefined number of monolayers (e.g. only one, or only two). The procedure may be performed by preparing the surface layer of the substrate and performing ALD. The preparation may comprise covering the surface with dielectric, for example comprising $SiO_2$, $Al_2O_3$, $Si_3N_4$, a sacrificial layer of TiN, a sacrificial layer of a semiconductor such Si, Ge, GaAs, or others, for instance one or two layers of Si. The preparation may also comprise removing the native oxide from the substrate. After removing the native oxide, (111) oriented substrates, or an epitaxial layer of wurtzite AlN grown on (111) oriented substrates in AlN[0 0 01]//Si[1 1 1] relationship, or 4H or 6H SiC, also epitaxially grown on a (111) substrate allow to control the orientation of the $MX_2$ by epitaxial seeding with the basal plane being substantially parallel to the surface. The semiconductor surface can be pre-functionalized, e.g. pre-sulphidized by annealing the substrate, either after deposition of the protective layer, or after native oxide removal, in $H_2S$ at T of about 400° C. The reduction of the $W^{6+}$ precursor can follow a few different pathways: i) by uptake of electrons from an n-type doped Si substrate; ii) by applying a $H_2$ plasma such that active H radicals can interact in the chemistry and reduce the $W^{6+}$, or iii) by addition of $Si_2H_6$ as a strong reducing agent. This avoids the need for a catalyst during the ALD initiation and hence helps preserving a high purity film, e.g. having Zn and C impurities below $1e18/cm^3$. ALD may also be directly performed on the sacrificial layer, whose thickness may control the reaction and formation of the TMD layers. In case a semiconductor is used as sacrificial layer, the functionalization step may be omitted before thermal ALD. Using multiple metal and/or chalcogenide precursors, e.g. Mo and W, S and Se, allows to make mixtures of metal dichalcogenides (e.g. $MoS_2/WS_2$, or $MoS_2/MoSe_2$) in well-controlled ratios, for example 50% $MoS_2$ and 50% $WS_2$, or 1/3 $MoS_2$ and 2/3 $WS_2$ or any other ratio N/M. This allows bandgap engineering of the deposited materials.

Applications:

A method according to embodiments of the present invention allows to produce semiconductor devices with extremely small dimensions. Such devices are particularly suited for continued scaling beyond Si CMOS technology nodes (e.g. beyond the 12 nm technology node). The stack of monolayers of $MX_2$ materials may e.g. be used as alternative transistor channel material for regular MOSFET devices in low-power CMOS, or as material for heterostructures such as used in tunneling devices (TFET), or as material for spintronics. Such devices may have in particular the following advantages:

- high $I_{ON}/I_{OFF}$ ratio, providing low power consumption in the OFF-state,
- low subthreshold voltage swing, hence suitable for low voltage operation,
- lower dielectric constant than Silicon resulting in a smaller characteristic length, and therefore no short channel effects expected at small gate lengths,
- low dimensional material (thickness of 1 monolayer of about 0.68 nm), hence ultra-thin body,
- $MoS_2$ layers (basal planes) are believed to be chemically inert due to the sulfur termination. In contrast, the edges of patterned $MX_2$ are highly active due to the dangling bonds at these edges;

The method described above may also be particularly suited for producing optoelectronic devices requiring transparent semiconductors. Transparent material allows use as driving circuits for OLEDs, or as tunable band gap (e.g. by alloys) enables LED.

The method described above may also be particularly suited for producing electronics on flexible substrates, e.g. wearable electronics, e-newspaper, etc.

The method described above may also be particularly suited for producing gas sensing devices because they exhibit a highly selective response to electron donors (higher selectivity than CNT sensors), and have quick response times.

The invention claimed is:

1. A method of producing at least one transition metal dichalcogenide layer ($MX_2$) on a substrate, the method comprising:
    - obtaining a substrate having a surface;
    - functionalizing the surface before depositing a transition metal dichalcogenide layer ($MX_2$); and
    - depositing the transition metal dichalcogenide layer ($MX_2$) on the surface using ALD deposition, starting from a metal halide precursor and a chalcogen source ($H_2X$).

2. The method according to claim 1, wherein the surface comprises at least one layer of dielectric.

3. The method according to claim 2, wherein the at least one layer of dielectric comprises at least one of: $Si_3N_4$, $SiO_2$, $Al_2O_3$, $HfO_2$, or $ZrO_2$.

4. The method according to claim 2, wherein the at least one layer of dielectric is formed via epitaxial growth.

5. The method according to claim 1, wherein the surface comprises a sacrificial layer.

6. The method according to claim 1, wherein functionalizing the surface comprises functionalizing the surface with at least one of: $SiH_4$, $Si_2H_2$, $Si_2H_6$, $Si_3H_8$, $B_2H_6$, or a combination thereof.

7. The method according to claim 1, wherein functionalizing the surface comprises an $O_3$ oxidation at 40° C. to 80° C. for 200 to 1000 msec.

8. The method according to claim 1, wherein functionalizing the surface comprises annealing the substrate with $H_2S$ at a temperature in the range of 300° C. to 550° C. during a period ranging from 1 to 40 minutes.

9. The method according to claim 1, wherein depositing the transition metal dichalcogenide layer ($MX_2$) on the surface using ALD deposition comprises depositing the transition metal dichalcogenide layer ($MX_2$) on the surface using Plasma Enhanced ALD deposition.

10. The method according to claim 1, wherein depositing the transition metal dichalcogenide layer ($MX_2$) is performed at a deposition temperature in the range of 250° C. to 450° C.

11. The method according to claim 1, further comprising removing a native oxide from the surface.

12. The method according to claim 11, wherein removing the native oxide comprises $HF/H_2O$ dipping the substrate.

13. The method according to claim 12, wherein removing the native oxide further comprises $H_2$ baking of the substrate during at least 5 minutes at a temperature in the range of 700° C. to 800° C.

14. The method according to claim 1, wherein a metal of the metal halide precursor is selected from the group consisting of Mo and W, and wherein a chalcogen of the chalcogen source ($H_2X$) is selected from the group consisting of S, Se, and Te.

15. The method according to claim 1, wherein the substrate comprises a (111) oriented semiconductor substrate or a substrate having a surface which is suitable for epitaxial seeding of a transition metal dichalcogenide layer.

16. A method of producing at least two transition metal dichalcogenide materials on a substrate, the method comprising:
    - providing a first metal dichalcogenide material on the substrate using the method of claim 1, thereby using a first metal halide precursor and a first chalcogen source; and
    - providing a second metal dichalcogenide material on the substrate by using ALD deposition, starting from a second metal halide precursor and a second chalcogen source, wherein the first metal halide precursor is different from the second metal halide precursor and/or the first chalcogen source is different from the second chalcogen source.

17. The method according to claim 1, further comprising providing a sulphur layer on the surface.

18. The method according to claim 17, further comprising exposing the substrate to a plurality of gas pulses, wherein the gas pulses comprise at least one of: $WF_6$, $Si_2H_6$, $H_2S$, or an inert gas.

19. The method according to claim 17, wherein providing the sulphur layer comprises exposing the substrate to $H_2S$.

* * * * *